United States Patent [19]
Geen et al.

[11] Patent Number: 4,764,748
[45] Date of Patent: Aug. 16, 1988

[54] ANALOG-TO-DIGITAL CONVERSION APPARATUS WITH DITHER SIGNAL

[75] Inventors: John A. Geen; Brian Johnson, both of Bracknell, England

[73] Assignee: British Aerospace Public Limited Company, London, England

[21] Appl. No.: 917,265

[22] Filed: Oct. 8, 1986

Related U.S. Application Data

[63] Continuation of Ser. No. 752,723, Jul. 8, 1985, abandoned.

[30] Foreign Application Priority Data

Jul. 6, 1984 [GB] United Kingdom .................. 8417324

[51] Int. Cl.$^4$ ............................................. H03M 1/20
[52] U.S. Cl. ...................... 340/347 AD; 340/347 CC; 340/347 M; 375/26
[58] Field of Search .... 340/347 AD, 347 M, 347 CC; 375/26

[56] References Cited

U.S. PATENT DOCUMENTS 3,879,724  4/1975  McDonald .................. 340/347 AD
4,564,831  1/1986  Wheable et al. ............ 340/347 AD

FOREIGN PATENT DOCUMENTS 0037259  10/1981  European Pat. Off. .
0098744   1/1984  European Pat. Off. .
2232881   1/1975  France .
1444682   8/1976  United Kingdom .

Primary Examiner—T. J. Sloyan
Attorney, Agent, or Firm—Cushman, Darby & Cushman

[57] ABSTRACT

Analog-to-digital converters are subject to errors including the known half least significant bit quantization error and also bit weighting errors due to lack of an ideal binary relationship between the transition points of all the bits. The known statistical average error reduction method in which a relatively small dither component is added to the analog input signal can only fractionally reduce overall error and has little effect on bit weighting errors. Herein the analog signal is added to a dither signal, for example a ramp signal, which varies through half the peak to peak digitization range of the converter so that irrespective of the input signal all output signal bits, other than the most significant bit, are "on" for one half of the sampling period. The result is that all the less significant bit errors are cancelled leaving only the easily compensated most significant bit error. A random component can be added to the dither signal to reduce the quantization error.

6 Claims, 1 Drawing Sheet

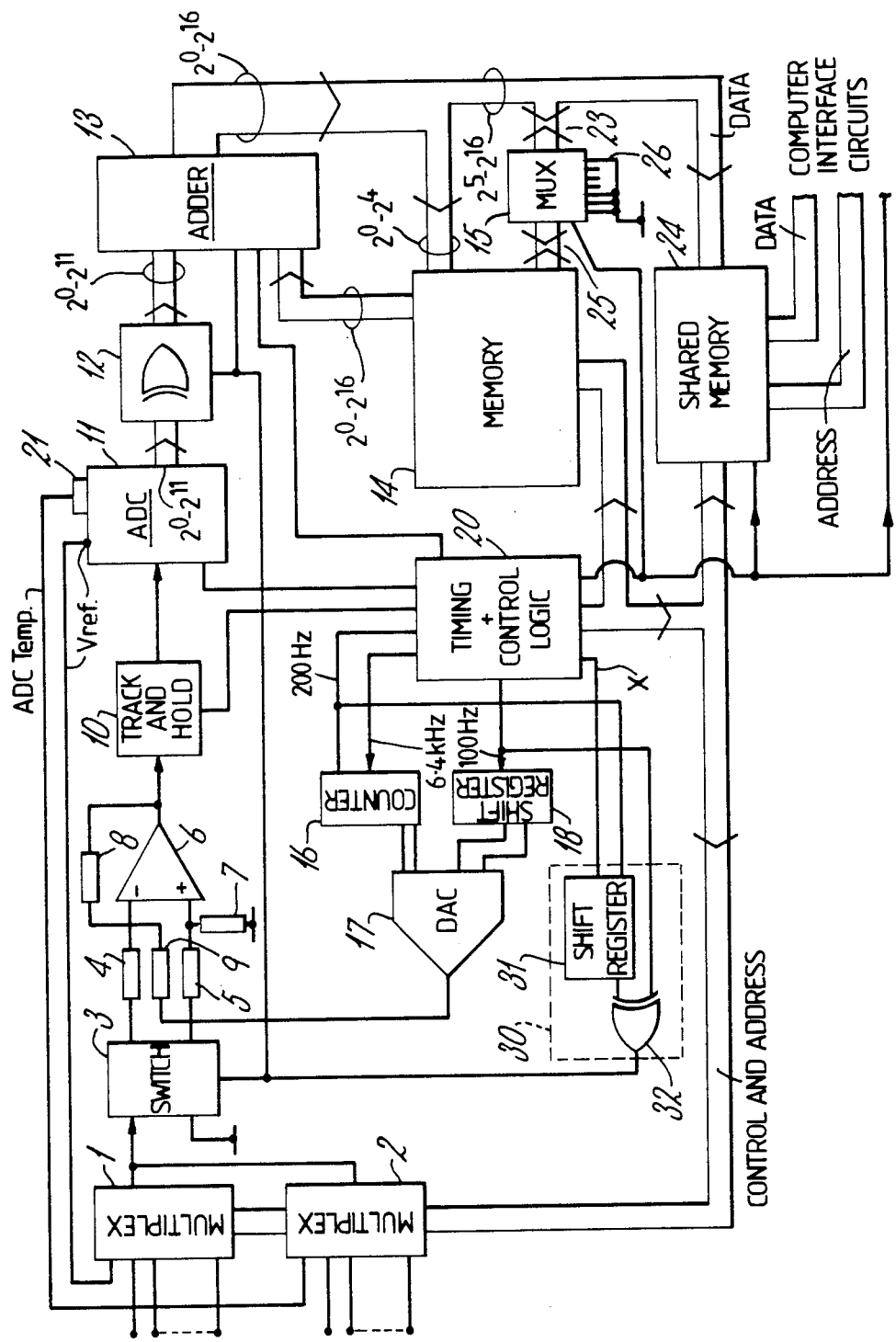

ANALOG-TO-DIGITAL CONVERSION APPARATUS WITH DITHER SIGNAL

This is a continuation of application Ser. No. 752,723, filed July 8, 1985 and now abandoned.

This invention relates to analog-to-digital conversion systems. More particularly, but not exclusively, it relates to an A/D conversion system usable in conjuction with an attitude sensing system incorporating a gyroscope, for providing to a computer digital samples of the output signals from the attitude sensing system.

The process of A/D conversion is subject to various error and inaccuracy inducing factors which may be particularly acute in the exemplary context mentioned above. For example, an attitude sensing system will generally produce a plurality of signals requiring accurate digitisation while weight considerations and the like render it undesirable to provide a separate converter for each signal. Also, some of the signals may contain a periodic noise component linked to the gyroscope wheel rotation and termed 'wheel noise'.

According to one aspect of the invention, there is provided analog-to-digital conversion apparatus in which a digital signal representative of an analog signal is formed by supplying the analog signal to an analog-to-digital converter along with a dither signal and combining the resultant series of digitised samples of the dithered analog signal, characterised in that the dither signal is such that said series of digitised samples comprise a uniformly distributed range of values extending through half the digital output range of said converter.

According to a second aspect of the invention, there is provided analog-to-digital conversion apparatus for forming a digital signal representative of one component of an analog signal which also contains a periodic noise component, the apparatus comprising an analog-to-digital converter for forming a series of digitised samples of the analog signal, means for averaging the digitised samples, and synchronisation means for ensuring that the averaging period is so synchronised with said periodic noise component that it is averaged substantially to zero over said period.

According to a third aspect of the invention, there is provided analog-to-digital conversion apparatus comprising an analog-to-digital converter, multiplexing means for directing analog signals to said converter from a plurality of input channels and for appropriately identifying the resultant converter output signals, and connection means for applying a reference signal associated with said converter to one of said input channels whereby there is made available at the output of said converter a digital signal for use in calibrating the converter.

For a better understanding of the above and further aspects of the invention, reference will now be made, by way of example, to the accompanying drawing the single FIGURE of which is a simplified circuit diagram of an analog-to-digital conversion system.

The illustrated analog-to-digital converter apparatus is intended to be used in an attitude control system to digitise analog signals received via a series of input channels, the signals in the respective channels being the axis rates from an attitude measuring gyroscope and the output signals from a set of accelerometers, and a series of compensation signals such as from a set of magnetometers, temperature sensors, an altimeter and an air-speed sensor. The various items which produce the analog signals are not shown. The digital values produced by the circuit are made available to a computer which is also not shown. Some of the digital values, particularly those derived from the gyroscope and accelerometer signals, are to be updated by the computer at a greater rate than the other signals, say at 100 Hz against perhaps 10 Hz or 1 Hz for respective ones of the other signals. To assist an understanding of the following description, it will be assumed that the higher update rate is to be 100 Hz. Correspondingly, this rate defines what will be called the 'update interval' to have a duration of ten milliseconds. It will, of course, be appreciated that the update rate and interval are a matter of choice. The analog signals of which the digital values are to be updated at the higher rate are applied to respective inputs of a multiplexer 1 while the lower update rate signals are applied to respective inputs of a multiplexer 2. The multiplexers 1 and 2 also receive control and address signals from a timing and control logic unit 20. In order to achieve the different update rates a sub-multiplexing technique is used. Namely, during each ten millisecond update interval the address signals applied to the multiplexers are so manipulated that all the higher rate signals and a selected one of the lower rate signals are sampled in sequence. That one of the lower rate signals which is selected for inclusion in the sampling sequence changes from interval to interval according to a sequence which repeats over a multiple of the update intervals and which is designed so as to give the required update rates for those signals. During each update interval, the sampling sequence repeats a number of times, say sixty four times, so that say sixty four samples of each of the higher rate signals and of the selected lower rate signal are taken. Again so as to aid in understanding the following, it will be assumed that the sequence does repeat sixty four times although again it should be understood that this FIGURE is a matter of design choice. The samples are passed to one input terminal of a changeover switch 3 which also has an input terminal connected to a zero volt source and two output terminals connected via respective resistors 4 and 5 to the inverting and non-inverting inputs of a differential amplifier 6. The non-inverting input is also connected to ground via resistor 7 while the inverting input of the amplifier receives both a gain-setting negative feedback signal via resistor 8 and a dither signal, derived as described later, via resistor 9. The output of the amplifier 6 is connected to the input of a track and hold amplifier 10 which tracks the output of amplifier 6 and at an appropriate time whilst each sample (plus dither) is appearing at its output, is caused by the circuit 20 to hold that sample. Each such held sample is then digitized by a twelve-bit successive-approximation analog-to-digital converter 11 in response to a control signal from the circuit 20. The converter 11 has an output terminal V ref. where the voltage reference signal, generated and used within the converter as the reference value for the conversion, is made available. To provide bipolar operation, the converter 11 incorporates an internal offset resistor arrangement so that a zero volt input signal produces a mid-range digital output signal. The most significant output bit $2^{11}$ of the converter thus represents the polarity of the input signal while the other output bits indicate its magnitude. In addition, there is attached to or combined into the converter 11 a temperature sensor 21 which makes available a signal ADC Temp. indicative of the temperature of the converter. The two signals V ref. and ADC Temp. are passed back to the multiplexers 1 and 2 as respective further analog signals to be digitised and made available to the computer. The digitized value of signal V ref. is to be updated at the same rate as the gyroscope and accelerometer output signals so it is fed to one input of the multiplexer 1 while the digitized analog-to-digital converter temperature signal ADC Temp. need only be updated at say one second intervals so it is applied to the multiplexer 2.

The twelve-bit outputs $2^0$ to $2^{11}$ of the converter 11 are each fed to one input of a respective one of twelve two-input exclusive OR gates (not separately shown) comprised in a gating circuit 12. The outputs of the gates are applied to corresponding inputs of a 17-bit adder 13. By way of data bus 22, the less significant bit outputs $2^0$ to $2^4$ of the adder 13 are connected to corresponding bit inputs of a 17-bit word memory circuit 14. Meanwhile, the twelve more significant bit outputs $2^5$ to $2^{16}$ of the adder are applied to respective terminals of a first port 23 of a multiplexer 15 and are also made available to a shared transfer memory circuit 24. As well as port 23, the multiplexer 15 has two further ports 25 and 26. The terminals of port 25 are connected to corresponding ones of the bit inputs $2^5$–$2^{16}$ of memory circuit 14 while the terminals of port 26 are simply connected together and grounded. Under the control of circuit 20, multiplexer 15 is operable to make through connections either between the terminals of ports 23 and 25 or between the terminals of ports 23 and 26.

The data outputs $2^0$ to $2^{16}$ of the memory circuit 14 are connected to corresponding ones of the other set of bit inputs of adder 13. Meanwhile, the address lines and the read and write control lines of the memory circuit 14 receive appropriate signals from the circuit 20.

The aforementioned dither signal which is added to the input signal samples by way of resistor 9, is formed by a dither signal generator comprising a five-bit counter 16, a sixteen-bit digital-to-analog converter 17 (which need not be 16 bit accurate so that it may be mechanised with two 8-bit devices), and a pseudo-random binary sequence generator in the form of an 11-bit shift register 18 with appropriate feedback interconnections (not shown) between its stages so that, as it is clocked by a 100 Hz signal fed to it from the circuit 20, it forms at its stage outputs some appropriate irregular (but, in the long term, repetitive) sequence of digital signal values in known manner. The 100 Hz signal is so synchronised by the circuit 20 that the value of the signal formed by register 18 remains constant during any one ten millisecond update interval but changes from interval to interval. The stage outputs of the shift register 18 are connected to the eleven less significant bit inputs of the digital-to-analog converter. The clock input of counter 16 is driven by a 6.4 KHz clock signal from circuit 20 and it thus produces a five-bit (thirty two-step) staircase waveform which repeats twice during each ten millisecond update interval. The bit outputs of counter 16 are applied to the five more significant bit inputs of the digital-to-analog converter 17. Although it is not strictly necessary, since the number of bits of counter 16 is such that in response to the 6.4 KHz clock signal the required ramp repetition period is achieved, this period is ensured by applying a 200 Hz reset signal to the reset terminal of the counter from the circuit 20. The dither signal at the output of the converter 17 thus comprises a repetitive ramp ie a sawtooth signal which repeats twice during each update interval combined with a pseudo-randomly varying walk of which the level remains constant during any one update interval but which changes in step-wise manner between one such update interval and the next. The dither has a magnitude at the analog-to-digital converter input, of half the peak to peak range of the converter. This ensures that each bit, other than the most significant bit is active for just half the time and therefore, as described later, the converter bit weighting errors appear as a simple converter bias instead of a complex non-linearity and can be removed.

The 100 Hz and 200 Hz signals from the circuit 20 and a signal X having a frequency equal to 6.4 KHz times the number of input signals sampled during each update interval are applied to an 'auto-zero' signal generator 30 which is operable to produce at its output an auto-zero signal comprising a cyclic sequence of binary values having a repetition period equal to the ten millisecond update interval and of which the first and second halves are exactly inverse one to the other. In the example shown, the generator 30 comprises a three stage shift register 31 with interstage feedback connections (not shown) to form it into a simple pseudo-random binary sequence generator as well known in the art. The shift register is clocked by the signal X and reset by the 200 Hz signal so that, at any of its stage outputs, there appears a repetitive sequence of binary values which sequence repeats every five milliseconds ie twice in each update interval. The binary value may change at each repetition of the signal X but does not necessarily do so, ie the sequence can include groups of sucussive 'one' values and groups of successive 'zeros'. The signal X is synchronised to the manipulation of the address signals fed to the multiplexers 1 and 2 so that, for each sample formed by the multiplexers, the binary signal from register 31 remains constant but the signal may change from one sample to the next. One of the stage outputs of the shift register 18 is fed to one input of an exclusive OR gate 32 of which the other input is fed with the 100 Hz signal. Thus, during one of the two repetitions of the binary value sequence from register 31 in each update interval, the values remain unchanged by gate 32 while during the other repetition, each value in the sequence is inverted.

The auto-zero signal is fed to the control input of switch 3, to the second input of each of the exclusive OR gates in circuit 12, and to the 'Carry' input of the adder 13.

As mentioned, during any one update interval, sixty four samples of each high update rate input signal and one low update rate signal are passed on to the switch 3 and subsequent circuit components by the multiplexers 1 and 2. The samples plus the added dither signal are then digitised and presented to the adder 13. For each analog signal, there is a corresponding sixteen bit wide word space available in the memory circuit 14. The circuit 20 addresses the memory circuit 14 so that, whilst the digital value of any one sample (plus dither) is presented to the adder 13, the memory word corresponding to the input signal of which a sample is so presented, is also presented to the adder. Thus, the adder adds the new sample value to the existing content of the corresponding word and restores it in memory 14 via the data input of the memory circuit. During this time, the ports 23 and 25 of multiplexer 15 are linked together. Thus, at the end of an update interval, the memory words associated with the high update rate signals and the word associated with the low update rate signal selected during that interval, will each contain the sum of sixty four digitized samples (plus dither) of the associated signals, the samples of each signal having been taken at intervals spread out over the update interval.

At the end of the update interval, the more significant bits $2^5$ to $2^{16}$ of each updated word in memory circuit 14 are read out of the memory circuit 14 via multiplexer 15 into the shared transfer memory 24, the address signals applied to the memory circuit 14 and the transfer memory being manipulated appropriately by circuit 20. The transfer memory is shared with the computer and will comprise appropriate multiplex circuits (not shown) enabling the computer and the converter apparatus to have access to it alternately. During the transfer time following each update interval, the converter apparatus gains such access, the circuit 20 meanwhile supplying a 'memory not available' signal to the computer. Then during the subsequent update interval, the computer has access to the transfer memory and can read the updated digital values therefrom as and when it requires during this interval. Also during the transfer period, the circuit 20 causes ports 23 and 26 of the multiplexer to be connected so as to make zero signals available to overwrite the transferred bits of each transferred digital word, ie in effect, to zeroise this portion of each transferred word. Meanwhile, however, the less significant bits $2^0$ to $2^4$ of each word in memory circuit 14 are kept.

The main errors which, were they uncompensated, could affect the operation of the illustrated system are: first, offset errors caused by inaccuracy of the mid-range offset resistor arrangement used within the converter 11 to achieve bipolar operation and also by the presence of offsets within other system components such as the amplifier 6 and the sample and hold circuit 10; second, there may be scale factor instability due to temperature drift of the resistors used in the analog-to-digital converter 11 and the various buffer amplifiers used; third there are the well-known quantisation errors in the converter incurred by its resolution limitation (and which would be present even with an 'ideal' converter); fourth, since economically the converter is not 'ideal', there would be bit weighting errors determined by the extent to which the relative values of the reference resistors in the converter 11 differ from the ideal binary relationship, and fifth, a carry-over or crosstalk from one multiplexer channel to subsequent channels caused by dielectric absorption in the hold capacitor and amplifier settling times, both electrical and thermal. In addition, consideration may have to be given to the presence of some dominant noise component in the signals received along the system input channels—in particular, the gyroscope output signals to be digitised by the system shown will generally comprise so-called gyro wheel noise, in the form of a sinusoidal component at a fixed frequency determined by the speed of rotation of the gyroscope wheel.

In the illustrated system, the offset errors and the cross-talk errors are reduced by an auto-zeroing feature involving the changeover switch 3 and the gating circuit 12. Switch 3 operates so that, whenever the auto-zero signal has one value, the polarity of the sample being received via the multiplexer 1 or 2 is reversed. Meanwhile, each bit of the digital signal from the converter 11 is inverted by the gating circuit 12. As mentioned earlier, the auto-zero signal sequence period is equal to the update interval and the first and second halves of the sequence are inverse one to another. Thus half the number of samples added to each word of memory circuit 14 during each update interval will be taken while the input signal is being inverted by switch 3 and these samples will be re-inverted by circuit 12. Meanwhile, any offsets introduced between the switch 3 and circuit 12 will be subject only to the reversing action of circuit 12 and hence, over a complete update interval, will be summed to zero in memory 14. The application of the auto-zero signal to the carry input of adder 13 assists in the proper handling of negative signals.

Any scale factor instability is compensated by feeding the converter reference V ref. and the converter temperature signal ADC Temp. through appropriate system input channels and hence to the computer as described earlier. The computer can then use the signal V ref. to automatically calibrate the converter system. In a sense, the apparatus can be regarded as supplying, not the absolute values of the input signals but rather values representative of the ratios between the input signal values and the reference value $V_{ref}$. The value of $V_{ref}$ is known to the computer and, in addition, it receives a digital value of $V_{ref}$ formed by the converter apparatus in exactly the same way that the digital values of the input signals are formed and hence subject to the same scale factor errors. These errors can thus be cancelled, say by the computer making the calculation $V_1 = V_{ref} \times N_1/N_R$ where $V_1$ is the value of the input signal to be determined, $N_1$ is the digital value of the input signal formed by the apparatus, and $N_R$ is the digital value of $V_{ref}$ formed by the apparatus. The signal ADC Temp. is used to correct the signal V ref. for temperature variation.

The gyro wheel noise is compensated by ensuring that the computer sampling interval is synchronised with the wheel drive noise so that the noise is cancelled out by the summation in memory 14. In the particular example shown, the synchronisation is such that exactly one complete gyroscope wheel noise cycle occurs in each half of the update interval, ie in each half of the auto-zero signal sequence, so that the noise averages to zero over the update interval.

The quantization error, ie the resolution error related to the ideal A/D transfer function and comprising uniformly distributed inaccuracies of plus or minus one half the magnitude represented by the least significant A/D output bit, is reduced by the random component of the dither signal added to the sampled signals and the subsequent effective averaging of samples in memory 14. As is known, this technique gives an effective improvement in the converter resolution. Provided the dither and sampling waveforms are such that the samples are uniformly distributed in between levels corresponding to the converter least significant bit being set and not set, the quantization error is reduced by a factor $\sqrt{n}$ where n is the number of uncorrelated samples averaged. Ideally, the dither waveform should comprise a fully random component but the fact that, in the illustrated system, the dither is only pseudo-random does not prevent any improvement being obtained—rather it only limits the maximum error reduction factor and, provided the pseudo-random signal generator is properly designed, that factor can be made fully sufficient. In any case, particularly in the described context, the analog signals fed to the converter system will generally themselves comprise an additional random noise component which will disturb the pseudo-random signal repetition and transform the quantization errors to a more random state.

As mentioned earlier, bit weighting errors represent the extent to which the reference resistor values in the converter 11 deviate from their ideal binary relationship, the result being a non-linearity of the converter which does not have a one least significant bit periodicity. As opposed to the relatively easily dealt with quantization errors, the adequate reduction of bit weighting errors forms the main design criteria for the dither waveform parameters.

For an ideal analog-to-digital converter in unipolar mode, the contribution of the nth bit to the output is:

$$y_n(x) = \left( \tfrac{1}{2} - 2/\pi \sum_{r_{odd}}^{\infty} \frac{\sin(2^n \pi r x)}{r} \right) \cdot \frac{1}{2^n} \quad (1)$$

Thus, if the nth bit is in error by $E_n$, the total error is:

$$B(x) = \sum_{n=1}^{n} E_n \left( \tfrac{1}{2} - 2/\pi \sum_{r_{odd}}^{\infty} \frac{\sin(2^n \pi r x)}{r} \right) \quad (2)$$

If a dither waveform is applied which equally weights A levels of uniform separation $\Delta$ then the average error is:

$$b(V) = \sum_{n=1}^{N} (E_n/2) - \quad (3)$$

$$(2/\pi A) \sum_{n=1}^{A} \sum_{n=1}^{N} \sum_{r_{odd}}^{\infty} E_n \frac{\sin[2^n \pi r(a\Delta + V)]}{r}$$

where V is the input level, ie the sum of the A/D input and the internal offset for bipolar operation.

The offset $$\sum_{n=1}^{N} (E_n/2)$$

is constant and is hence removed by the auto-zeroing effect of gating circuit 12. The remaining non-linearity error contribution of the nth bit is $$\sum_{r_{odd}}^{\infty} (-b_{n,r})$$

where:

$$b_{n,r} = 2E_n/(\pi A r) \left[ \cos(2^n \pi r V) \sum_{a=1}^{A} \sin(2^n \pi r a \Delta) + \sin(2^n \pi r V) \sum_{a=1}^{A} \cos(2^n \pi r a \Delta) \right] \quad (4)$$

If $A\Delta = \tfrac{1}{2}$, ie if the sampled levels cover exactly half the range of the A/D, then for $n > 1$ and all integer values of r, $$\sum_{a=1}^{A} \sin(2^n \pi r a \Delta) = \sum_{a=1}^{A} \cos(2^n \pi r a \Delta) = \phi \quad (5)$$

Also, for $n = 1$, $$\sum_{r_{odd}}^{\infty} (-b_{n,r}) = E_1(V - \tfrac{1}{2}) \quad (6)$$

Thus, the contributions of all the bit errors disappear with the exception of the most significant bit error which becomes a scale factor correction.

In certain low-cost applications it is possible to use sensor noise in place of the deliberately added noise. Then, it is necessary to consider quantisation error in the present of a sinusoidal noise input nulled by synchronous sampling.

Let y(V) be the output of an ideal ADC for an input V which is unipolar, that is, a bipolar input together with the bipolar offset.

$$y(V) = \sum_{n=1}^{N} \tfrac{1}{2}^{n+1} \left[ 1 - 4/\pi \sum_{r_{odd}}^{\infty} \frac{\sin(2^n \pi r V)}{r} \right] \quad (7)$$

ie. the output range is considered normalised to 1 and is the sum of binary weighted bits, bit 1 being the m.s.b. and bit N being the l.s.b.

If Q(V) be the quantisation error defined by $$Q(V) = V - y(V) \quad (8)$$

then Q(V) is a sawtooth function of V with period equivalent to 1 l.s.b. in signal space.

$$Q(V) = -1/(2^N \pi) \sum_{s=1}^{\infty} (-1)^s \cdot \frac{\sin(2^{N+1} \pi s V)}{s} \quad (9)$$

In the presence of a sinusoidal noise, V takes the form $\alpha + \beta \sin(wt)$ where $\alpha$ is the d.c. term and w is the angular frequency with respect to time, t.

With this substitution, Q(t) can be expanded in terms of $J_k$, the Bessel functions of the first kind and order k, thus:

$$Q(t) = \frac{-1}{2^N \pi} \sum_{s=1}^{\infty} \frac{(-1)^s}{s} \left[ \sin(2^{N+1} \pi s \alpha) \left( J_0(2^{N+1} \pi s \beta) + 2 \sum_{k=1}^{\infty} J_{2k}(2^{N+1} \pi s \beta) \cos(2k\,wt) \right) + \cos(2^{N+1} \pi s \alpha) \left( 2 \sum_{k=1}^{\infty} J_{2k-1}(2^{N+1} \pi s \beta) \sin((2k-1)wt) \right) \right] \quad (10)$$

This expression is not easy to evaluate numerically but is valuable as a qualitative and semiquantitative indication of the errors generated.

In particular it shows the extreme sensitivity of the errors to variations in $\alpha$ and $\beta$ and suggests that a comparatively small variation is $\beta$ may vary the constant components of Q through a full range of positive and negative values, providing a means of transforming the residual non-linearities into noise with a much smaller mean.

The terms in $J_0$ are not self-cancelling whereas most of the time dependent terms average out in the same way as the noise signal itself.

The exceptions are those terms which are harmonics of the A/D sampling rate, M times per auto-zero half period, and are consequently rectified by the sampling process.

The auto-zeroing alternates V between $\rho+\frac{1}{2}+a+\beta \sin(wt)$ and $\rho+\frac{1}{2}-a-\beta \sin(wt)$ where $a$ is the input signal less the noise, $\frac{1}{2}$ is the ideal bipolar offset and $\rho$ is the hardware offset plus applied pseudo-random level. Noting that $J_o$ and $J_{2k}$ are even functions whereas $J_{(2k-1)}$ are odd functions it can be shown that the auto-zeroed value of Q(t) approximates $$\frac{-1}{2^N\pi} \sum_{s=1}^{\infty} \frac{(-1)^s}{s} \left[ \sin(2^{N+1}\pi s a) \left( J_o(2^{N+1}\pi s \beta) + 2\sum_{l=1}^{\infty} J_{2lM}(2^{N+1}\pi s \beta)\cos(2lM\theta) \right) + \cos(2^{N+1}\pi s a) \left( 2\sum_{l=1}^{\infty} J_{(2l-1)M}(2^{N+1}\pi s \beta)\sin((2l-1)M\theta) \right) \right] \quad (11)$$

for small $\rho$, where $\theta$ is the phase offset between the sampling and noise waveforms, and where M is odd.

If M is even there are no terms in $\cos(2^{N+1}\pi s a)$ and the even order terms contain $$\sum_{l=1}^{\infty} J_{lM}(2^{N+1}\pi s \beta).$$

To obtain an estimate of the magnitude of this error, first the value of $\beta$ is needed, Typically, $\beta \approx 10^{-2}$ and N=12 so, for M=32, $2^{N+1}\pi\beta \approx 257 \approx 8M$. The significance of this is that the rectification terms have Bessel functions of large order and large argument, on the basis of which, asymptopic expansions can be used.

Second, with the exception of the $J_o$ term, some approximations are made based on asymptopic expansion.

For large x, $$J_k(x) \sim \sqrt{(2/\pi x)} \cos\left(x - \frac{k\pi}{2} - \frac{\pi}{4}\right).$$

That is, alternate terms in the sums $$\sum_{l=1}^{\infty} J_{2lM} \text{ and } \sum_{l=1}^{\infty} J_{(2l-1)M}$$

cancel pretty well.

For large k, $$J_k(x) \sim 1/\sqrt{(2\pi k)} \; (ex/2k)^k$$

That is, for $x<k$ the value of $J_k(x)$ diminishes very rapidly as $k-x$ increases, also the first extremal of $J_k(x)$ is at $x \approx k$ for large k so that the sum $$\sum_{h=1}^{\infty} J_k(x)$$

effectively terminates at k=x. So, $$\sum_{l}^{\infty} J_{2lM}(x) \approx \phi \text{ or } \sqrt{(2/\pi x)} \cos(x - \pi/4)$$

depending on whether the integer part of $2^N\pi\beta/M$ is even or odd. Similarly $$\sum_{l}^{\infty} J_{(2l-1)M}(x) \approx \phi \text{ or } \sqrt{(2/\pi x)} \sin(x - \pi/4)$$

So the magnitude of the error will not exceed $$\left| \frac{1}{2^N\pi^2} \sum_{s=1}^{\infty} \frac{(-1)^s}{s\sqrt{2^N s \beta}} [3\sin(2^{N+1}\pi s a)\cos(2^{N+1}\pi s \beta - \pi/4) + 2\cos(2^{N+1}\pi s a)\sin(2^{N+1}\pi s \beta - \pi/4) \right.$$

for the case where M is odd. The maximum values occurring for $M\theta$ modulo $2\pi = \pm\pi/2$.

At each value of s the trigonometric terms maximise near 3 for values of $\alpha$, $\beta$ repeating at intervals of $\frac{1}{2}$N s.

If one takes this maximum for s=1 then the trig terms are near zero for s=2, nearly inverted for s=3, zero for s=4 etc, so bearing in mind the coefficient $1/(s\sqrt{s})$ one can take $$1/(2^{N+1}\sqrt{(2^{N+1}\beta)})$$

as a rough estimate of the upper bound on the residual non-linearity error.

If M is taken as even the same result follows.

In the case of $\beta = \frac{1}{2}^7$ this upper bound is 15 ppm of the DAC range.

It should alsio be noted that, in the embodiment described, the dither is applied on the A/D side of the first auto-zero switch and does not, therefore, have an error residual of this type.

The sawtooth component of the dither signal could be replaced by a component having some other waveform shape, triangular for example, provided there is still obtained a uniform sample distribution extending through the m.s.b. range of the A/D. The auto-zero signal sequence may need to be changed correspondingly. For example, if a triangular waveform is used, the second half of the auto-zero signal swquence in each update interval can be time inverted as well as having each binary value inverted, ie so that the two halves of the sequence are inverted right to left (like a mirror image) as well as being inverted top to bottom.

The removal of offset errors could be carried out by a simplified embodiment in which the auto-zero signal generator 30 is discarded and, instead, the switch 3 and gate 12 (and the adder carry input are simply driven by the 100 Hz signal from circuit 20 say so that, for one complete half of the update interval, the switch 3 and gate 12 do not carry out inversion while, in the second half of the inveral, they do carry out inversion. The function of the more complex auto-zero signal sequence formed by generator 30 is to remove the settling time and dielectric absorption errors (cross-talk errors). With the more complex sequence, it is still the case (as with the simple half on, half off signal) that half the samples taken during an update interval are inverted and half are not but, in addition, this sequence is effective to decorrelate the polarity of each channel with the polarities of the preceeding channels.

Many fixed patterns of change are avilable to fulfil this objective depending on the number of subsequent channels over which the residues are significant. A particularly simple pattern can be used if the lower accuracy requirement of the sub-multiplexed channels is exploited. However, it is fairly easy to generate a complex pattern which is effective over all channels, namely a pseudo random binary sequence incrementing at the same rate as the sawtooth steps.

Various modifications may be made to the illustrated embodiment. For example, instead of being as shown, the auto-zero signal generator 30 could comprise a counter driving the address inputs of a read-only memory wherein such signals have been pre-stored that, as the addresses of the memory are stepped through, the chosen auto-zero signal sequence appears at the memory output.

Since the multiplexers 1 and 2 are of the kind where the sampled input is selected by the address signals fed to the multiplexer, ie where the sampling sequence is determined by the circuit 20 rather than by any fixed pattern built into the multiplexer, the signals could all be handled by a single multiplexer even where the corresponding digital values are to be updated at different rates which may not in fact be required anyway. Where two (or more) multiplexers are used, they need not be connected in parallel as shown,—rather, the output of the multiplexer 2 could be fed to one of the inputs of the multiplexer 1—the sub-multiplexing effect is still obtained.

The signal $V_{ref}$ need not be obtained from the converter 11—it may be convenient to use the converter reference signal but, since the object of passing $V_{ref}$ through the converter apparatus is to make available to the computer a comparison value which has been through the same sampling and digitisation process as the input signals and is hence subject to like errors, $V_{ref}$ could be generated separately, say by a standard reference voltage generator (not shown). The temperature compensation signal, if still needed (it might not be needed in any case), could then be obtained from a sensor applied to the generator.

The changeover switch 3 could be replaced by an equivalent controllable analog inverter, say by an inverting amplifier circuit.

Instead of providing the timing and control logic circuit 20, the various synchronised clock signals and the control and address signals could be provided by the computer.

The illustrated way of making the digital values available to the computer could be modified. For example, the shared transfer memory circuit could be discarded and the values passed to the computer from the memory circuit 14.

Finally, it is emphasised that the given values of update interval, clock signal frequencies, number of samples per interval and so on are exemplary only and can be varied to suit the particular application of the apparatus.

It will be appreciated that the steps in the ramp signal formed by digital to analog converter 17 as they appear at the analog to digital converter 11 should not line up with the quantisation levels of the converter 11. This is in fact highly unlikely to happen even if no consideration is given to the point during detailed design of the apparatus—nevertheless it might need to be considered in certain situations.

What is claimed is:

1. Analog to digital signal conversion apparatus comprising:
    input signal receiving means for receiving an analog input signal to be digitized by the apparatus;
    summing means connected to said receiving means and operable for receiving a dither signal and for supplying at an output of the summing means the sum of said dither signal and said analog input signal;
    an analog to digital converter connected to the summing means and operable for supplying a digital output signal comprising a plurality of bits of which the most significant takes one or the other of the two bit values in dependence upon whether said sum is within one or the other half of a peak to peak digitization range associated with the converter;
    averaging means connected to the converter for forming a digital signal representative of the time average of the converter output signal; and
    dither signal supply means connected to the summing means for supplying a dither signal which varies step-wise through a dither range substantially equal to one-half of said peak to peak digitization range of the converter and which, on average, has a substantially uniform occupancy of all the dither range step levels.

2. Apparatus according to claim 1, wherein the dither signal supply means comprises:
    first signal supply means for supplying a repetitively and linearly varying first digital signal;
    second signal supply means for supplying a pseudo-randomly varying second digital signal;
    a digital to analog converter having an output connected to said summing means, a plurality of higher significance bit inputs connected to said first signal supply means, and a plurality of lower significance bit inputs connected to said second signal supply means.

3. Apparatus according to claim 2, including;
    first controllable inverting means connected between said input signal receiving means and said summing means;
    second controllable inverting means connected between said analog to digital converter and said averaging means;
    pseudo-random digital sequence generator means connected to the first and second controllable inverter means for causing the first inverter means to invert and not invert said analog input signal during alternate ones of a series of time intervals having a pseudo-random sequence of lengths, and for causing the second inverter means to invert and not invert the converter output signal in synchronism with the operation of the first inverting means, and
    timing signal generator means connected to said digital sequence generator means, and said first and second signal supply means for synchronizing the repetitions of said pseudo-random sequence of time interval lengths, the repetitions of said first digital signal and the time instants at which there occur changes in level of the second digital signal.

4. Apparatus according to claim 1, wherein said input signal receiving means comprises multiplexing means for receiving a plurality of analog input signals to be digitized by the apparatus and for passing selected ones of the signals in sequence to the summing means; and wherein said averaging means comprises a memory having a plurality of digital signal storage locations associated with respective ones of said analog input signals, and adding means connected to the converter and the memory for storing at said storage locations respective running totals of the digitized analog input signals.

5. Analog to digital signal conversion apparatus comprising:

an input for receiving an analog input signal;

summing means connected to said input and operable for receiving a dither signal and for supplying at an output of the summing means the sum of said dither signal and said analog input signal;

an analog to digital converter connected to the output of said summing means and operable for supplying a digital output signal which is representative of said sum provided said sum is within a peak to peak digitization range associated with the converter, and which includes a most significant and a plurality of progressively less significant bits, respective ones of the bits having one or the other of two bit values in dependance upon whether or not the sum is within respective associated quantization intervals having binary relationships with one another and the quantization interval associated with said most significant bit being substantially equal to one half of said peak to peak digitization range;

averaging means connected to said converter for forming a digital signal representative of the average of the converter output signal over a predetermined time interval; and dither signal supply means connected to said summing means and operable to supply a dither signal which varies through one half of said digitization range for causing the most significant bit of the converter output signal to have said one and said other bit value for respective proportions of the said time interval which are dependent upon said input signal while causing each less significant bit, irrespective of said input signal, to have one bit value for a total time equal to one half of the predetermined time interval and the other bit value for the remainder of the predetermined time interval.

6. Apparatus according to claim 5, wherein said dither signal includes a relatively small random or pseudo-random component for reducing the effect of any quantization error of said analog to digital converter.

* * * * *